(12) United States Patent
Yang

(10) Patent No.: US 7,773,406 B2
(45) Date of Patent: Aug. 10, 2010

(54) FERROELECTRIC RANDOM ACCESS MEMORY CIRCUITS FOR GUARDING AGAINST OPERATION WITH OUT-OF-RANGE VOLTAGES

(75) Inventor: Hee-Hyun Yang, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 128 days.

(21) Appl. No.: 12/107,585

(22) Filed: Apr. 22, 2008

(65) Prior Publication Data

US 2008/0253163 A1 Oct. 16, 2008

(51) Int. Cl.
*G11C 11/22* (2006.01)
(52) U.S. Cl. .................. 365/145; 365/201; 365/206; 365/230.03
(58) Field of Classification Search .................. 365/145, 365/189.07, 210, 230.03, 206, 201
See application file for complete search history.

(56) References Cited

U.S. PATENT DOCUMENTS 6,563,729 B2   5/2003   Brucklmeier et al.
6,704,218 B2   3/2004   Rickes et al.
6,850,428 B2   2/2005   Kang
7,375,998 B2*  5/2008   Yang ........................ 365/145

FOREIGN PATENT DOCUMENTS

JP   2004-095136      3/2004
JP   2004-355679     12/2004
KR   10-2004-0020340  3/2004

* cited by examiner

*Primary Examiner*—Hoai V Ho
(74) *Attorney, Agent, or Firm*—Myers Bigel Sibley & Sajovec, P.A.

(57) ABSTRACT

A semiconductor device can include a first ferroelectric random access memory to which a first voltage is applied and a second ferroelectric random access memory to which a second voltage is applied, where the second voltage is lower than the first voltage. A data protection circuit can determine whether test data is normally read from the second ferroelectric random access memory or whether a write-back operation is normally performed on the second ferroelectric random access memory on the basis of the second voltage. The data protection circuit can also generate a read prevention control signal to control whether a read operation is to be performed on the first ferroelectric random access memory based on the determined result.

2 Claims, 5 Drawing Sheets

FERROELECTRIC RANDOM ACCESS MEMORY CIRCUITS FOR GUARDING AGAINST OPERATION WITH OUT-OF-RANGE VOLTAGES

CROSS-REFERENCE TO RELATED PATENT APPLICATIONS

This application claims the benefit of Korean Patent Application No. 10-2005-0068950, filed on Jul. 28, 2005, in the Korean Intellectual Property Office and U.S. patent application Ser. No. 11/378,726, filed on Mar. 17, 2006, now issued as U.S. Pat. No. 7,375,998, the disclosures of which are incorporated herein in their entirety by reference.

FIELD OF THE INVENTION

The present invention relates to semiconductor devices, and more particularly, to ferroelectric random access memory (FRAM) cell arrays.

BACKGROUND

FIG. 1 is a circuit diagram of a conventional ferroelectric random access memory (FRAM) cell 10. Referring to FIG. 1, the FRAM cell 10 includes a switching transistor 11 and a ferroelectric capacitor 13 that are connected between a corresponding word line WL and a corresponding bit line BL. A FRAM is a next generation non-volatile memory using the polarization characteristics of ferroelectrics.

A write operation and a read operation are performed on the FRAM cell 10 based on a plate pulse applied to a plate line PL of the ferroelectric capacitor 13.

If a plate pulse is applied to the plate line PL in order to read data (for example, data "1") stored in the ferroelectric capacitor 13, the data "1" stored in the ferroelectric capacitor 13 is changed to data "0". Thus, in order to restore the data "1" stored in the ferroelectric capacitor 13 at the end of the read operation, the data "1" is written to the ferroelectric capacitor 13. This operation is called "write-back".

FIG. 2 is a timing diagram of a normal read operation performed on the conventional FRAM cell 10. Referring to FIGS. 1 and 2, the timing of a normal read operation based on an address signal ADD is largely divided into a charge sharing interval t1, a sensing interval t2, and a write-back interval t3.

In the charge sharing interval t1, charge sharing occurs in response to a plate pulse PPLS and a sense amplifier enable signal SAEN. In the sensing interval t2, data stored in the FRAM cell 10 is sensed by a sense amplifier (not shown). In the write-back interval t3, the original data, specifically, data "1", which can be damaged during a read operation, is restored (i.e., the read of the cell is destructive).

However, in the write-back interval t3, if a low voltage is applied to the plate line PL at a timing when the data "1" is restored in the FRAM cell 10, a normal write-back operation may not occur such that data stored in the ferroelectric capacitor 13 may be destroyed or changed.

SUMMARY

Embodiments according to the invention can provide ferroelectric random access memory circuits for guarding against operation with out-of-range voltages and methods of operating same a semiconductor device. Pursuant to these embodiments, a semiconductor device can include a first ferroelectric random access memory to which a first voltage is applied and a second ferroelectric random access memory to which a second voltage is applied, where the second voltage is lower than the first voltage. A data protection circuit can determine whether test data is normally read from the second ferroelectric random access memory or whether a write-back operation is normally performed on the second ferroelectric random access memory on the basis of the second voltage. The data protection circuit can also generate a read prevention control signal to control whether a read operation is to be performed on the first ferroelectric random access memory based on the determined result.

DESCRIPTION OF EMBODIMENTS ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
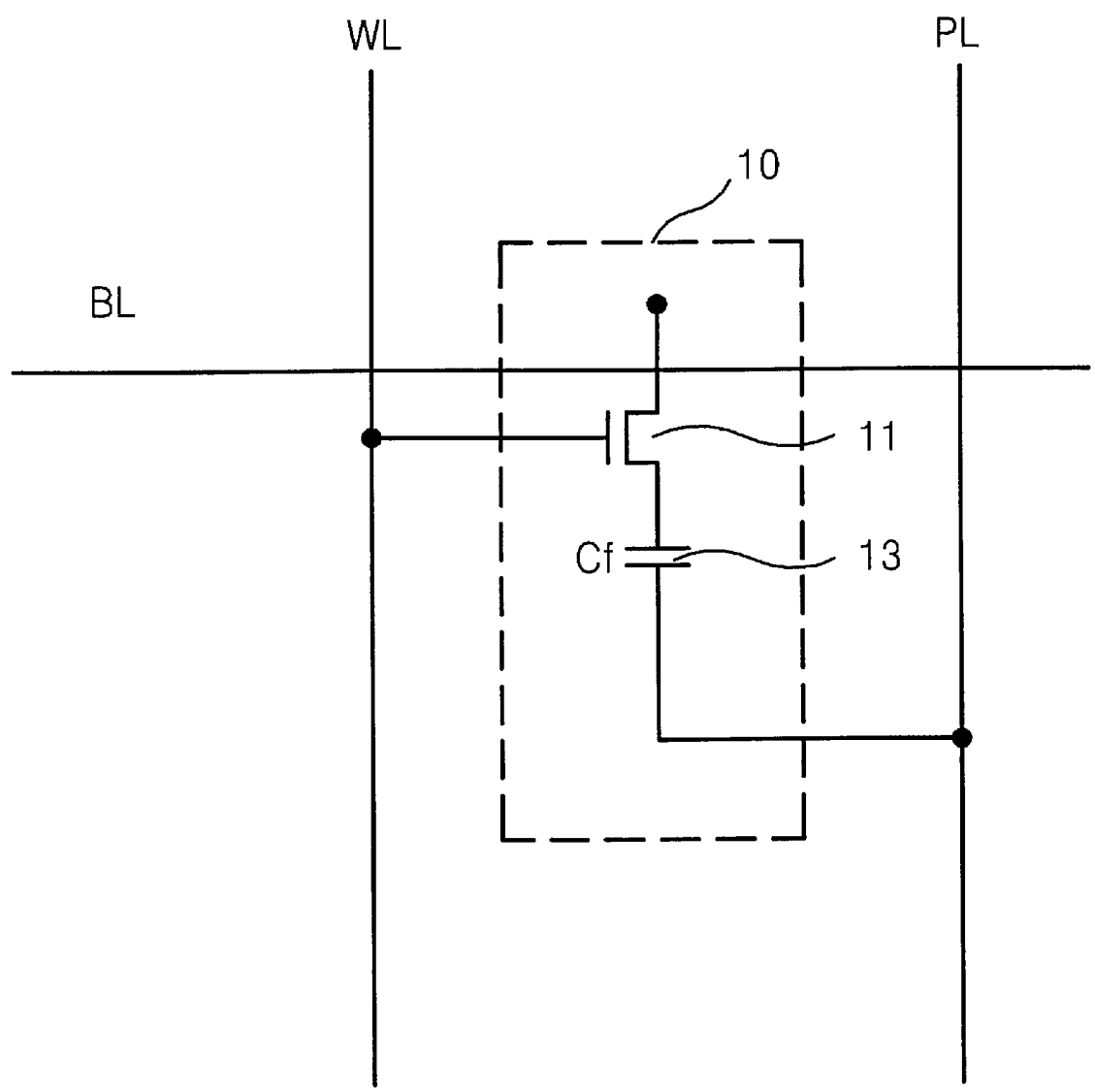
FIG. 1 is a circuit diagram of a conventional ferroelectric random access memory (FRAM) cell.
Figure 2:
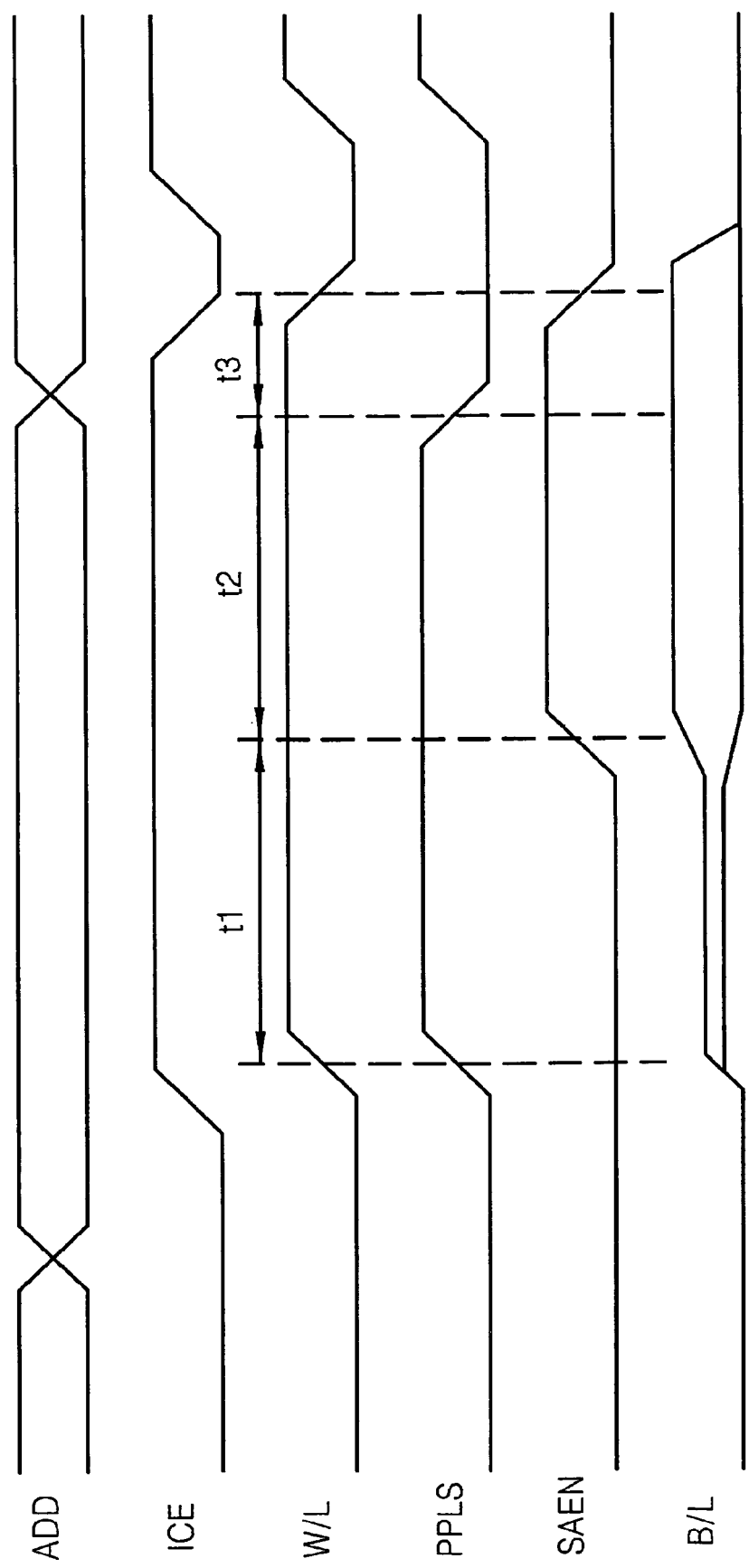
FIG. 2 is a timing diagram of a normal read operation performed on the conventional FRAM cell.
Figure 3:
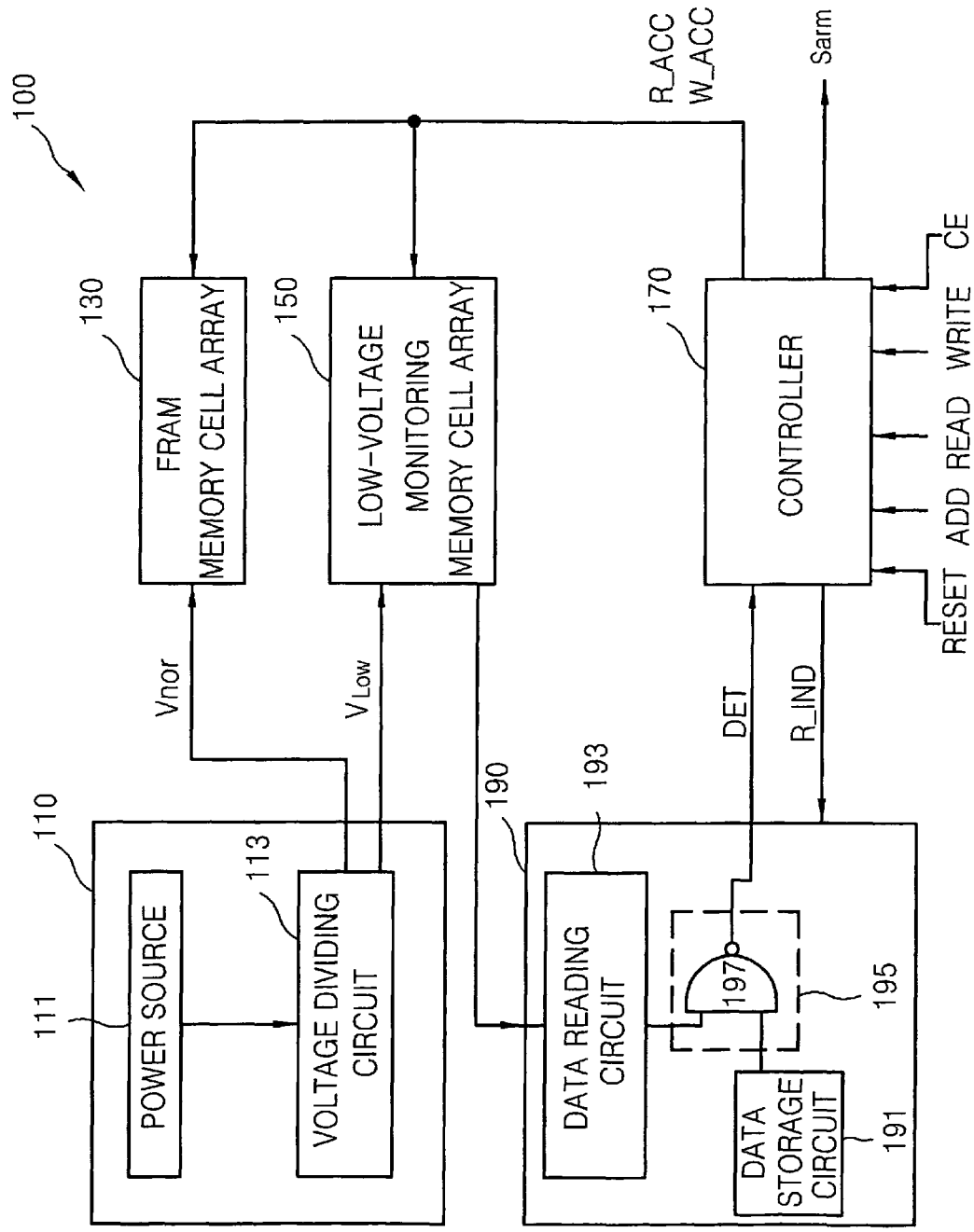
FIG. 3 is a block diagram of a memory device according to some embodiments of the present invention.

FIG. 3 is a block diagram of a memory device according to an embodiment of the present invention. Referring to FIG. 3, the memory device such as a semiconductor device 100 includes a voltage generation circuit 110, a ferroelectric random access memory (FRAM) cell array (or, a first memory) 130, a low-voltage monitoring memory cell array (or, a second memory) 150, a controller 170, and a data protection circuit 190.

The voltage generation circuit 110 generates a first voltage $V_{nor}$ and a second voltage $V_{Low}$. The voltage generation circuit 110 includes a power source 111 and a voltage dividing circuit 113. The power source generates a supply voltage, and the voltage dividing circuit 113 receives the supply voltage and divides the supply voltage to generate the first voltage $V_{nor}$ and the second voltage $V_{Low}$. The first voltage $V_{nor}$ is higher than the second voltage $V_{Low}$.

The FRAM cell array 130 includes a plurality of FRAM cells. Predetermined data is written to or read from each FRAM cell according to the first voltage $V_{nor}$. The first voltage $V_{nor}$ means at least one of voltages supplied to word lines, bit lines, and plate lines.

The low-voltage monitoring memory cell array 150 includes a plurality of FRAM cells. Predetermined data is written to or read from each FRAM cell according to the second voltage $V_{Low}$. The second voltage $V_{Low}$ is also at least one of voltages supplied to the word lines, the bit lines, and the plate lines.

The controller 170 generates a write access signal W_ACC for writing corresponding data to the FRAM cell array 130 and/or the low-voltage monitoring memory cell array 150, or a read access signal R_ACC for reading corresponding data from the FRAM cell array 130 and/or the low-voltage monitoring memory cell array 150, in response to a reset signal RESET, an address signal ADD, a read command READ, a write command WRITE, and a chip enable signal CE.

A write operation is performed on each of the FRAM cell array 130 and the low-voltage monitoring memory cell array 150 in response to the write access signal W_ACC and a read operation in response to the read access signal R_ACC, under the control of the controller 170.

The data protection circuit 190 compares test data with reference data in response to a control signal R_IND output from the controller 170, and generates a read prevention control signal DET on the basis of the comparison result. The control signal R_IND is associated with the read command READ.

The data protection circuit 190 includes a data storage circuit 191, a data reading circuit 193, and a comparison circuit 195.

The data storage circuit 191, which may be a register, stores the reference data (for example, data "1"). The data reading circuit 193 reads the test data from the low voltage memory cell array 150 using the second voltage $V_{Low}$, in response to the control signal R_IND.

The comparison circuit 195 compares the test data read by the data read circuit 193 with the reference data stored in the data storage circuit 191, and generates the read prevention control signal DET on the basis of the comparison result. The test data has data "1" or data "0" according to the second voltage $V_{Low}$ which is changed by noise, etc.

If the comparison circuit 195 is embodied as a NAND gate 197, the NAND gate 197 generates a deactivated read prevention control signal DET when the test data is equal to the reference data (when a read operation or a write-back operation is normally performed).

On the contrary, when the test data is different from the reference data (when the read operation or the write-back operation is not normally performed or the write-back operation may not be normally performed), the NAND gate 197 generates an activated read prevention control signal DET.

The controller 170 performs a read operation based on the read prevention control signal DET. For example, the controller 170 does not allow the read operation to be performed on the FRAM cell array 130 when the read prevention control signal DET is activated (when the second voltage $V_{Low}$ is lower than an initially set voltage due to noise, etc., and thus, a write-back operation may fail when data is read from the low-voltage monitoring memory cell array 150).

Also, when the read prevention control signal DET is activated while a read operation is performed on the FRAM cell array 130, the controller 170 delays stopping the read operation on the FRAM cell array 130 until the read operation is completed. This process is performed to prevent data stored in a predetermined memory from being destroyed during a read operation.

In other words, in some embodiments according to the invention, near the end of a read operation to the FRAM cell array 130, a write back operation is typically performed because if a read operation ends before a write back operation is done, data may be lost. Accordingly, when the read prevention control signal DET is activated during a read operation to the FRAM cell array 130, the controller 170 delays stopping the read operation to the FRAM cell array 130 until the write back operation is performed.

Also, the controller 170 controls read operations to be performed on the FRAM cell array 130 and the low-voltage monitoring memory cell array 150 at the same timing.

Figure 4:
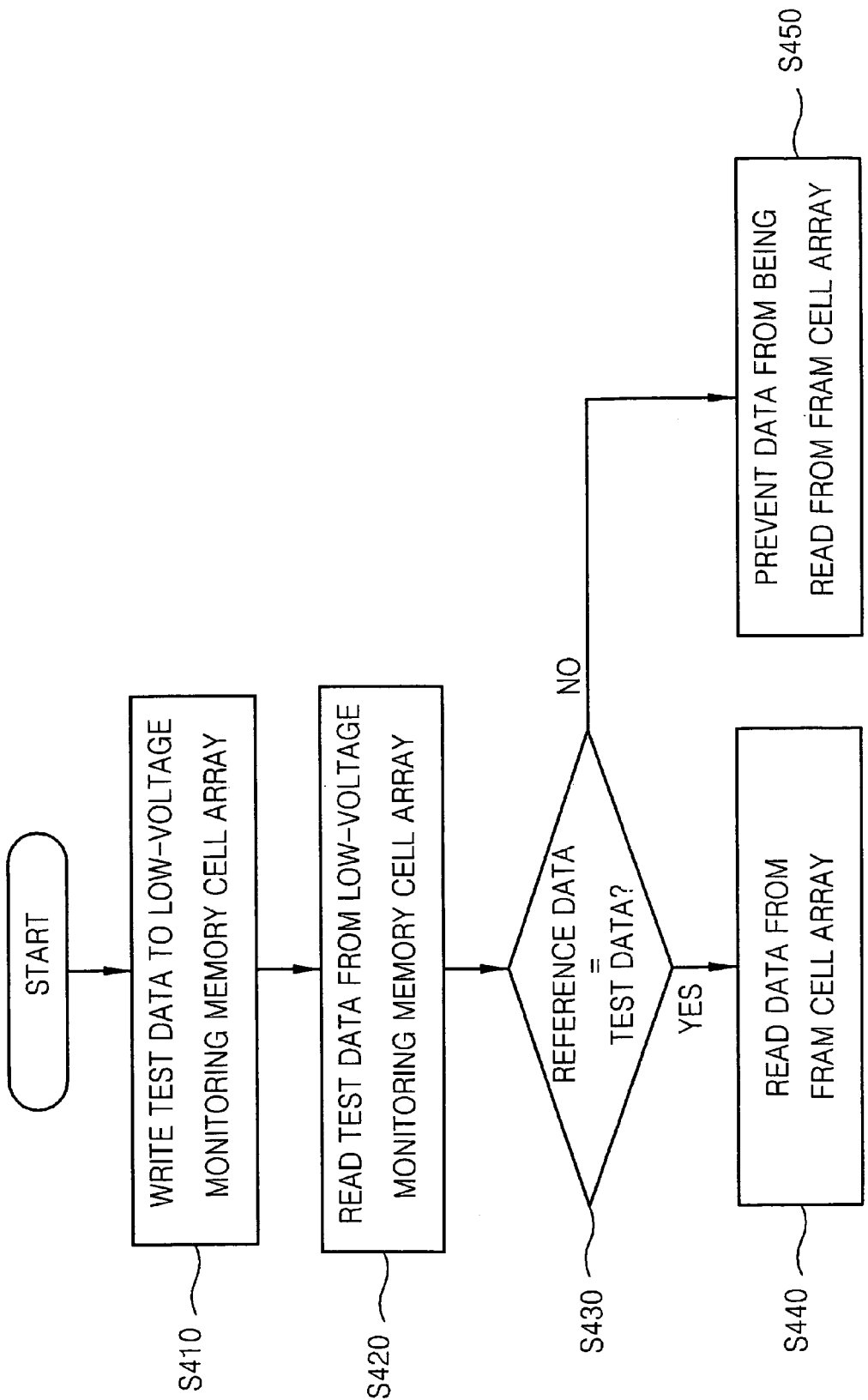
FIG. 4 is a flowchart illustrating an operation of a memory device according to some embodiments of the present invention.

FIG. 4 is a flowchart illustrating the operation of the memory device such as a semiconductor device 100 of FIG. 3 according to the embodiment of the present invention. Referring to FIGS. 3 and 4, the data protection circuit 190 of the semiconductor device 100 determines whether a write operation or read operation is normally being performed on the low-voltage monitoring memory cell array 150, when a supply voltage is initially applied to the semiconductor device 100 and a reset is released thereon.

The controller 170 or the data protection circuit 190 writes test data (for example, data "1") to the low-voltage monitoring memory cell array 150 using the second voltage $V_{Low}$ (operation S410).

At the same time when the controller 170 performs a read operation on the FRAM cell array 130, the data protection circuit 190 reads the test data from the low-voltage monitoring memory cell array 150 or data that is performed write-back, using the second voltage $V_{Low}$ (operation S420).

The data protection circuit 190 may read data "1" or data "0" based on a level of the second voltage $V_{Low}$. Also, the data protection circuit 190 may read data "1" or data "0" after a write-back operation.

The data protection circuit 190 determines whether the read test data ("1" or "0") is equal to reference data ("1") (operation S430).

If the test data is the same as the reference data, that is, if data "1" is read from the low-voltage monitoring memory cell 150 or if a write-back operation is normally performed thereon regardless of a drop of the second voltage $V_{Low}$, the data protection circuit 190 generates a deactivated read prevention control signal DET. Accordingly, the controller 170 controls a read operation preformed on the FRAM cell array 130 during the read operation (operation S440).

However, if data "1" cannot be read since the second voltage $V_{Low}$ becomes lower than an initially set voltage due to noise, etc. or if data read after a write-back operation is not the data "1", the data protection circuit 190 generates an activated read prevention control signal DET. Accordingly, the controller 170 prevents data from being read from the FRAM cell array 130 (operation S450).

If the data read operation on the FRAM cell array 130 has already been started before the read prevention control signal DET is activated, the controller 170 delays stopping the read operation on the FRAM cell array 130 even when the read prevention control signal DET is activated. This process is performed to prevent data from being destroyed during a read operation. The semiconductor device 100 performs operations S410 through S450 whenever a read operation is performed.

Accordingly, since the semiconductor device 100 prevents a read operation from being performed on the FRAM cell array 130 at a low voltage lower than the first voltage $V_{nor}$, for example, at a voltage lower than the second voltage $V_{Low}$, thereby preventing data stored in the FRAM cell array 130 from being destroyed or changed.

Since a read operation is normally performed on the conventional semiconductor device regardless of a supply voltage lower than an initially set voltage due to noise, etc., data "1" cannot be restored and may be destroyed or changed in the write-back operation.

Figure 5:
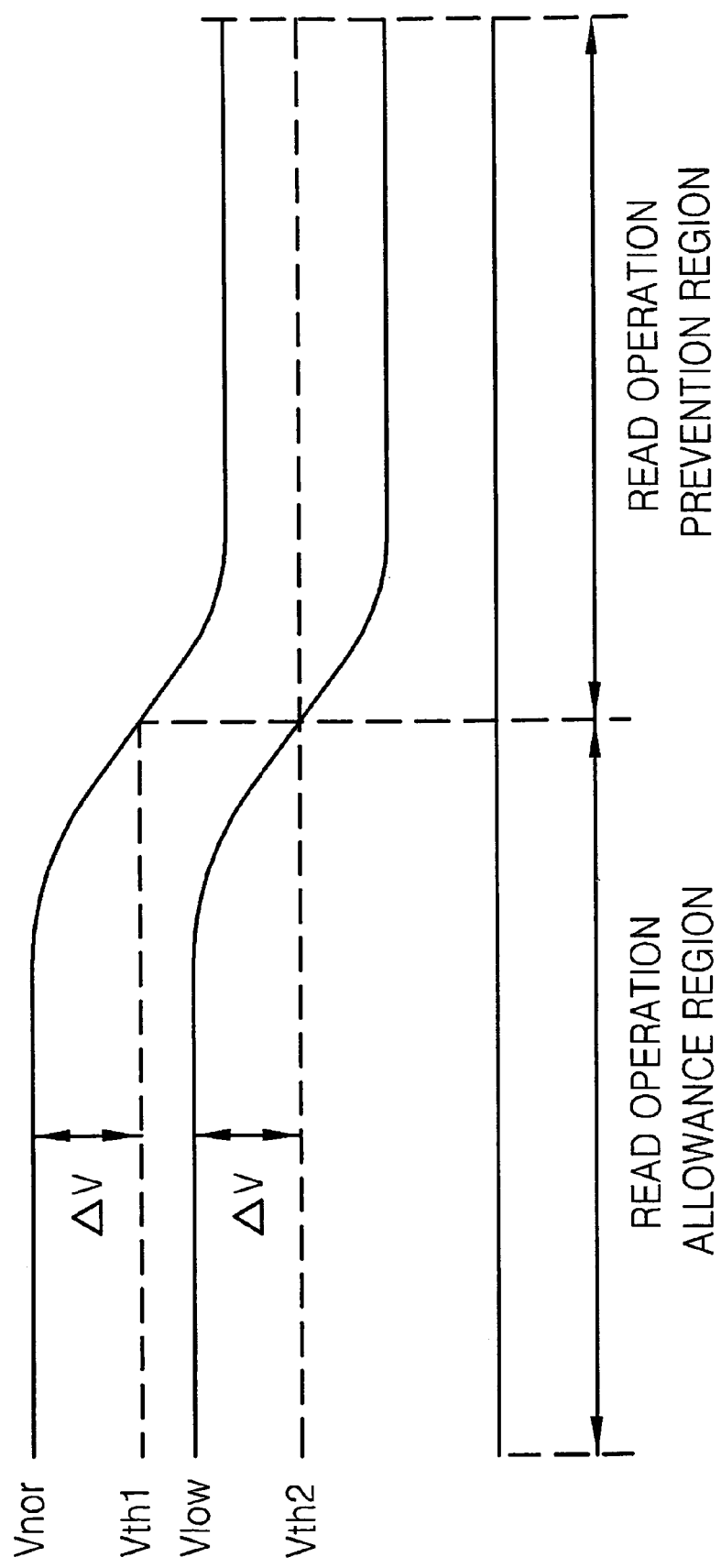
FIG. 5 is a timing diagram illustrating changes in a first voltage and a second voltage, caused by noise, etc.

FIG. 5 is a timing diagram illustrating changes in a first voltage $V_{nor}$ and a second voltage $V_{Low}$, caused by noise, etc. Referring to FIG. 5, assuming that the first voltage $V_{nor}$ falls to a third voltage $V_{th1}$ by a voltage drop $\Delta V$ due to noise and the second voltage $V_{Low}$ falls to a fourth voltage $V_{th2}$ by a voltage drop $\Delta V$ due to the noise, the semiconductor device 100 of FIG. 3 determines whether a read operation (or a write-back operation) is being normally performed on the low-voltage monitoring memory cell array 150 on the basis of the fourth voltage $V_{th2}$, and prevents a read operation from being performed on the FRAM cell array 130 at the third voltage $V_{th1}$ according to the determination result. In this case, the controller 170 can output a signal $S_{arm}$ informing a user of this fact.

That is, if an error occurs or may occur during a read operation on the low-voltage monitoring memory cell array 150 due to a voltage drop when a read operation is performed, the semiconductor device 100 prevents a read operation from being performed on the FRAM cell array 130 from being read. Accordingly, the semiconductor device 100 can prevent data stored in the FRAM cell array 130 from being destroyed during a read operation, thereby increasing the stability of data stored in the semiconductor device 100.

As described above, in a semiconductor device having a data protection circuit, according to the present invention, it is possible to prevent data stored in a FRAM cell array from being destroyed due to a drop in a supply voltage during a read operation. As a result, the data protection performance of a semiconductor device is enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A ferroelectric random access memory (FRAM) circuit comprising:
    a low-voltage FRAM monitoring memory array, separate from a FRAM memory cell array used to store data for retrieval, configured to receive a low voltage level provided thereto that is less than a normal voltage level provided to the FRAM memory cell array, both being substantially susceptible to noise to reduce the low voltage level and the normal voltage level.

2. A circuit according to claim 1 wherein the low-voltage FRAM monitoring memory array is used to test whether normal operation of the FRAM memory cell array can be provided with the noise affecting the normal voltage level.

* * * * *